United States Patent [19]

Bakermans et al.

[11] Patent Number: 4,682,129

[45] Date of Patent: Jul. 21, 1987

[54] THICK FILM PLANAR FILTER CONNECTOR HAVING SEPARATE GROUND PLANE SHIELD

[75] Inventors: Frank C. Bakermans, Raleigh, N.C.; Charles J. Trexler, York, Pa.

[73] Assignee: E. I. Du Pont de Nemours and Company, Wilmington, Del.

[21] Appl. No.: 803,369

[22] Filed: Dec. 2, 1985

Related U.S. Application Data

[63] Continuation-in-part of Ser. No. 480,592, Mar. 30, 1983, abandoned.

[51] Int. Cl.⁴ .......................................... H01P 13/648
[52] U.S. Cl. ..................................... 333/184; 333/185; 361/302; 361/329; 361/312; 439/92; 439/607
[58] Field of Search ................................ 333/182–185; 361/302, 303, 306, 309, 311, 312, 328–330; 339/147 R, 143 R, 14 R

[56] References Cited

U.S. PATENT DOCUMENTS

| | | | |
|---|---|---|---|
| 3,538,464 | 11/1970 | Walsh | 333/182 |
| 3,710,285 | 1/1973 | Schor et al. | 333/182 |
| 4,079,343 | 3/1978 | Nijman | 333/183 |
| 4,126,840 | 11/1978 | Selvin | 339/147 R X |
| 4,262,268 | 4/1981 | Shimada et al. | 333/182 |
| 4,362,350 | 12/1982 | von Harz | 339/143 R |
| 4,457,574 | 7/1984 | Walters | 339/143 R |
| 4,494,092 | 1/1985 | Griffin | 333/182 |
| 4,514,024 | 4/1985 | Clark | 339/143 R X |

FOREIGN PATENT DOCUMENTS

| | | |
|---|---|---|
| 1138944 | 1/1983 | Canada . |
| 2925374 | 10/1980 | Fed. Rep. of Germany . |
| 3016315 | 11/1981 | Fed. Rep. of Germany . |
| 2422268 | 12/1979 | France ........................ 361/302 |

OTHER PUBLICATIONS

Boutros, K; "A New Approach to the Design of EMI Filter Connectors Using Planor Filter"; Conf. 12th Annual Connector Symposium; Cherry Hill N.J.; 7/18 Oct. 1979, pp. 222–226.

Abe et al., Development of the Thick Film Capacitor and its Application for Hybrid Circuit Modules, Proceedings: Electronic Components Conf. 1979, pp. 277–285.

Sproull, et al., A High Performance Thick Film Capacitor System, Proceedings: Electronic Components Conf. 1978, pp. 38–46.

Viclan New Product Bulletin No. 4A, Introducing the P.C.A. Planar Capacitor Array.

*Primary Examiner*—Eugene R. LaRoche
*Assistant Examiner*—Benny T. Lee

[57] ABSTRACT

A filter connector for attenuating frequencies up to 1000 MHz having a conductive housing enclosing a planar filter element. Rows of conductive pins and associated capacitors are mounted on the filter element and there is a ground plane over one or both surfaces of the filter element. The pins pass through holes in each ground plane without touching it.

5 Claims, 12 Drawing Figures

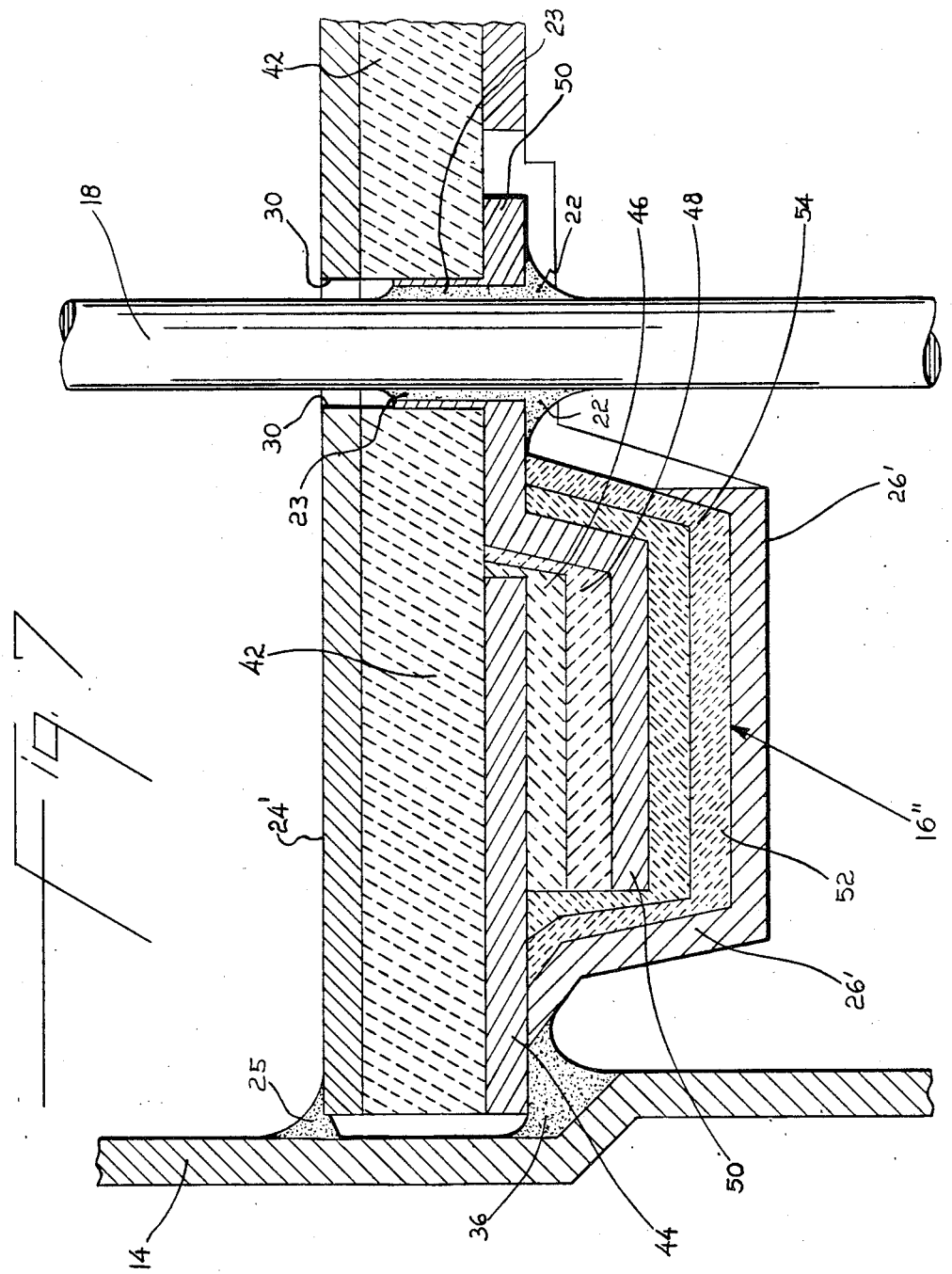

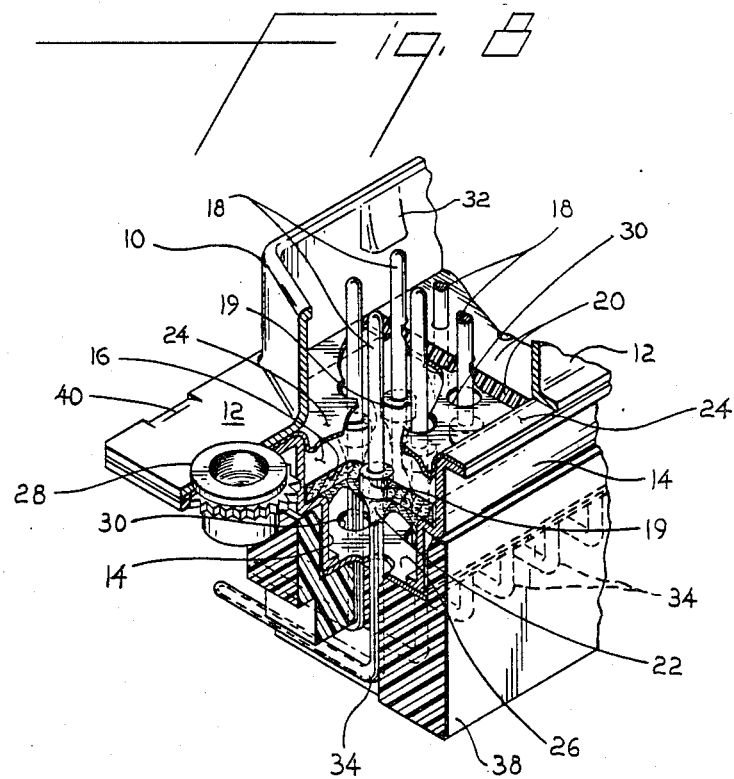

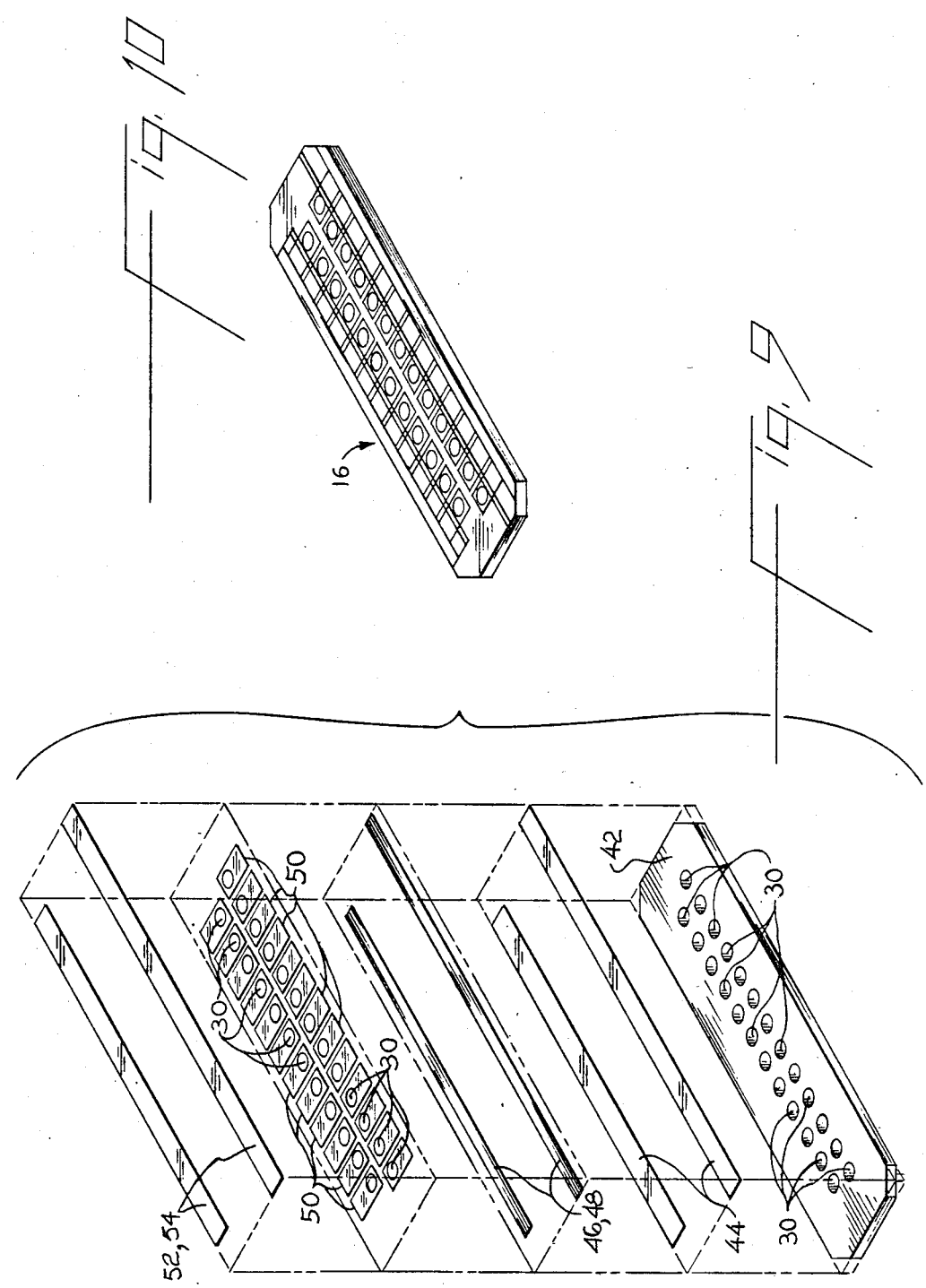

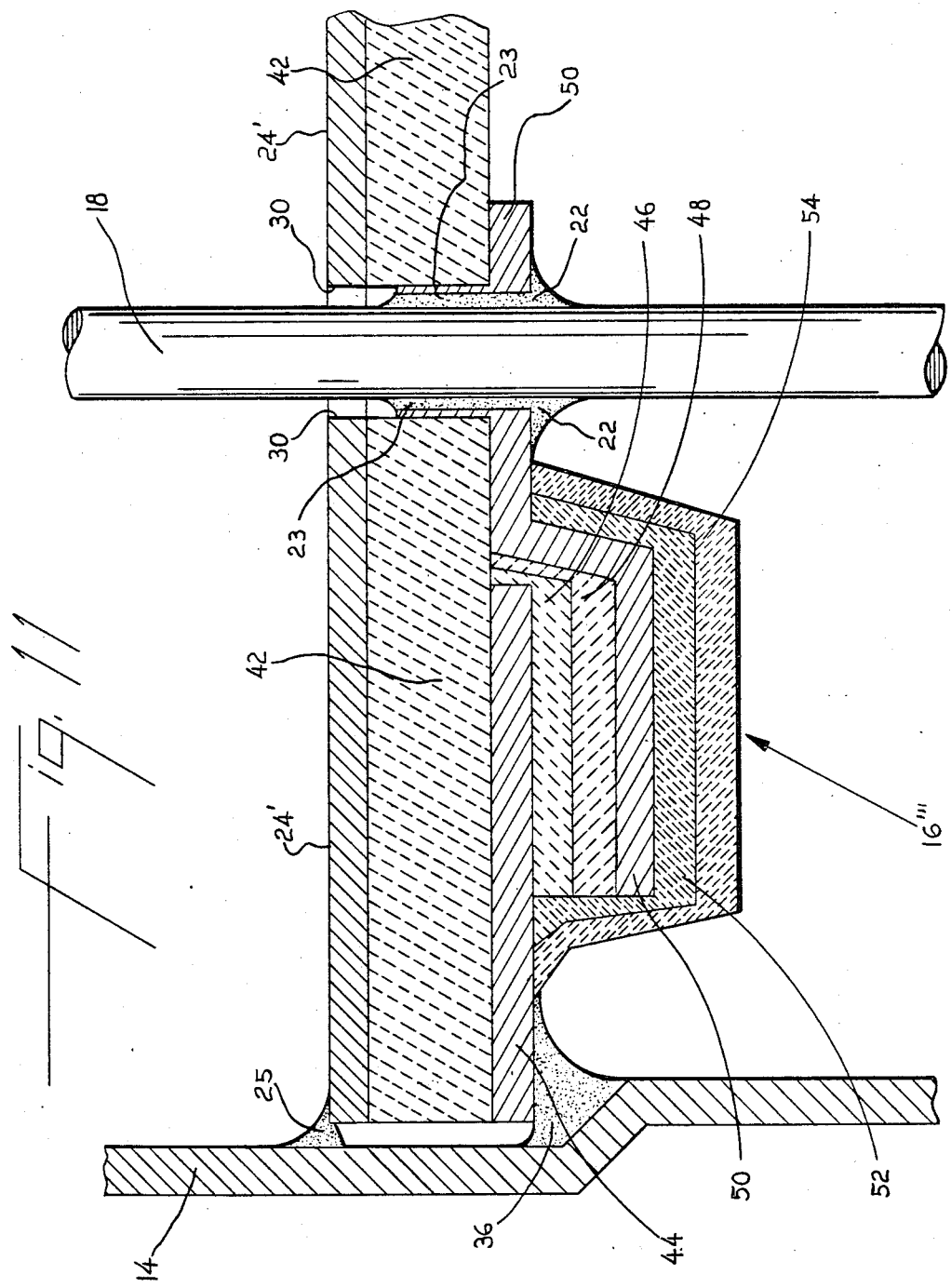

THICK FILM PLANAR FILTER CONNECTOR HAVING SEPARATE GROUND PLANE SHIELD

CROSS-REFERENCE

This is a continuation-in-part of our copending application Ser. No. 480,592, filed Mar. 30, 1983, now abandoned.

BACKGROUND OF THE INVENTION

1. Field of the Invention

This invention relates to a filter connector for reducing electromagnetic interference. More particularly, it refers to a filter connector having a filter member with added ground planes which improve the capability of attenuating high frequency electrical signals from a conductive element.

2. Prior Art

Filters have been employed for decades to attenuate high frequency electrical signals, especially for military purposes. These filters have been relatively sophisticated and expensive. In recent years, the common usage of computers and particularly home computers has resulted in the generation of significant additional amounts of high frequency electromagnetic signals interfering with other electrical devices. For the purpose of reducing the output of such signals, the United States Federal Communications Commission (FCC) has promulgated regulations requiring attenuation at their source. See 47 CFR 15, Subpart J.

Available commercial filters employing ferrite sleeves (U.S. Pat. No. 4,144,509) or monolithic capacitors structures with or without ferrites (U.S. Pat. No. 3,538,464) are expensive for use in low-cost electronic equipment such as the personal computer. A need exists for an inexpensive filter connector that will satisfactorily attenuate electromagnetic signals at ultrahigh frequencies, i.e., up to 1000 megahertz (MHz). A useful commercial filter attenuates the electromagnetic signal at least 30 decibels (dB) at a 1000 MHz frequency.

SUMMARY OF THE INVENTION

This invention is an inexpensive electrical connector for effectively filtering a wide band of frequencies up to 1000 MHz. The connector has a conductive housing enclosing a planar filter member which includes a series of two electrode capacitors with a conductive pin projecting from each capacitor. One of the electrodes in each capacitor is in electrical contact with its pin and the other is grounded to the conductive housing. There is a ground plane over at least one surface of the filter member and it has holes for accommodating the conductive pins without touching the pins. The filter improves attenuation at frequencies up to 1000 MHz over similar filter connectors without ground planes.

BRIEF DESCRIPTION OF THE DRAWINGS

FIG. 7 is a transverse sectional schematic of a second alternate filter member and ground plane assembly.

FIG. 8 is a sectional view of the filter connector having a ferrite sleeve around each pin.

FIG. 9 is an exploded inverted view of the filter members shown in FIGS. 5-7 and 11.

FIG. 10 is a perspective view of the filter member shown in FIG. 9.

FIG. 11 is a transverse sectional schematic of a third alternate filter member and ground plane assembly.

DESCRIPTION OF THE INVENTION

Figure 1:
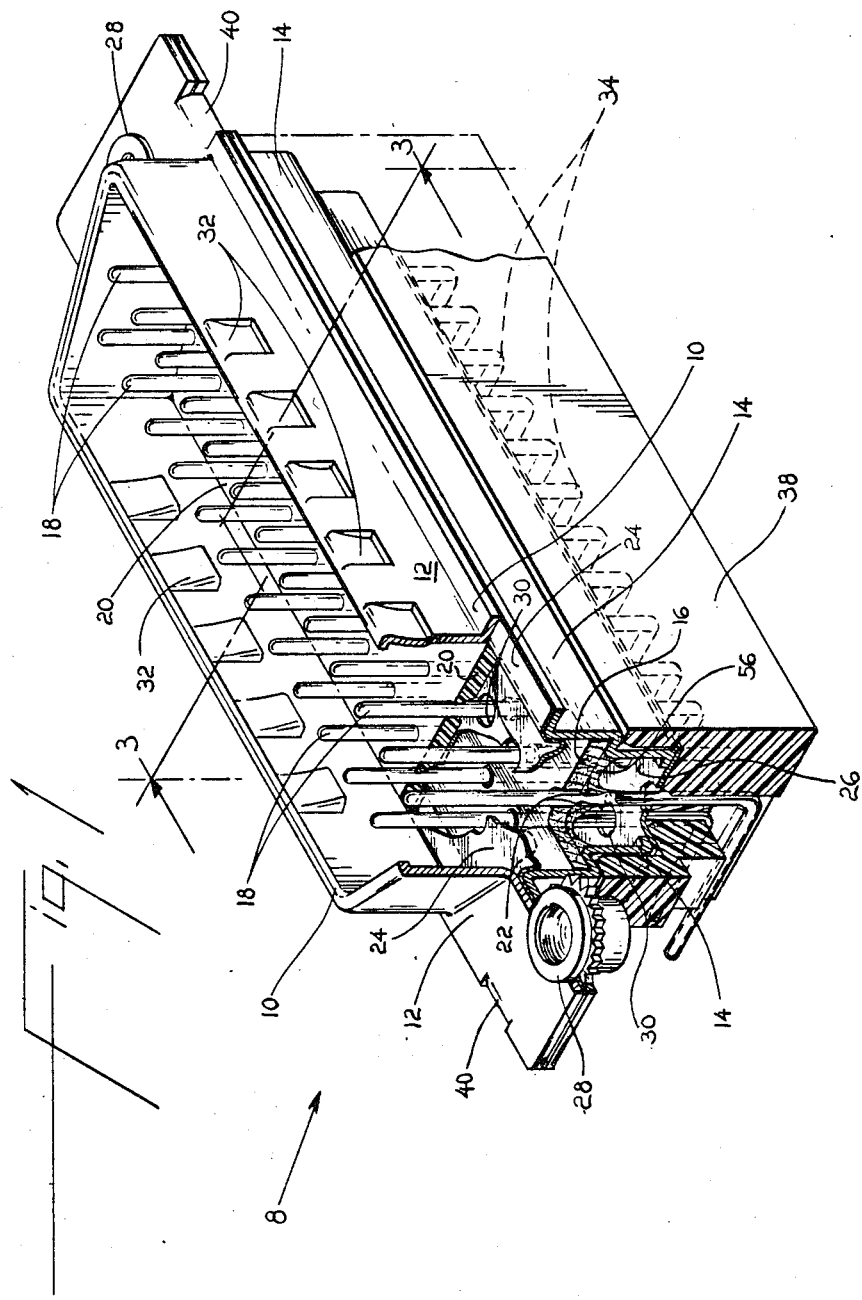
FIG. 1 is an isometric assembly, partially sectioned, of the filter connector.

Referring first to FIG. 1, the filter connector 8 comprises a conductive housing 10 made up of the top shell 12 and a bottom shell 14. The housing 10 encloses two rows of pins 18 mounted on and projecting from the opposed surfaces of a planar filter member 16. The interior of connector 8 is protected by a top insulator 20 and a bottom insulator 38. The pins 18 are individually mounted on the filter member 16 by solder joints 22.

The attenuation drop of at least thirty decibels at 1000 MHz is derived from this connector by using one or more ground planes 24 and 26. Each ground plane has holes 30 which are larger than and clear the pins 18, i.e., the pins pass through the holes without touching the ground plane. Each ground plane has peripheral edges soldered to the housing shell 14. In FIGS. 1-5, the ground planes 24 and 26 are spaced from the filter member 16.

A threaded insert 28 can be included in the connector optionally to provide a mounting fixture to a cabinet. Contacts 32 are made available on the top shell 12 to provide a ground contact for a female plug (not shown) inserted over the pins 18. The two shells 12 and 14 are crimped together by tabs 40. Pins 18 can be either straight or right-angled 34 as shown in FIGS. 1-3.

Figure 2:
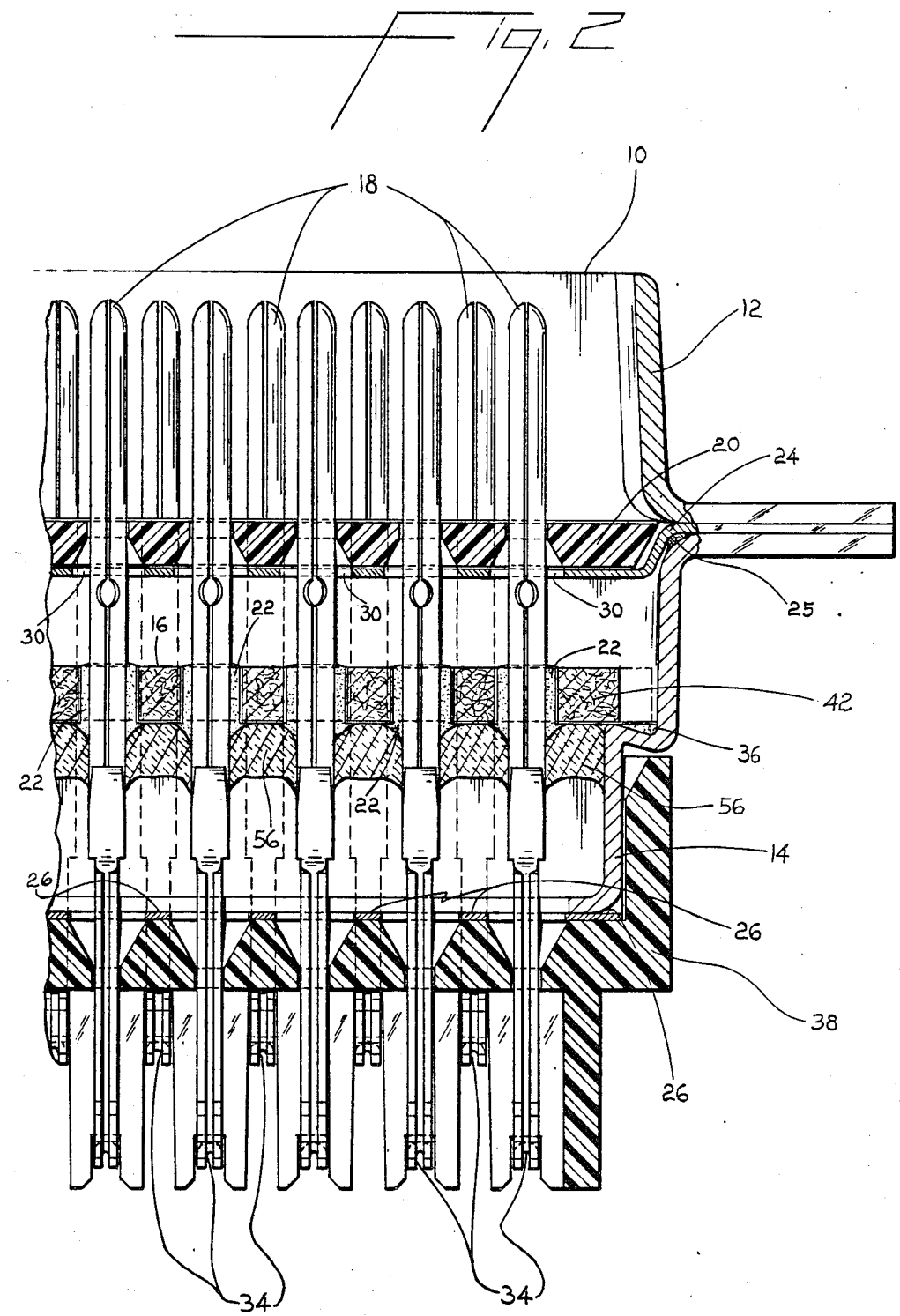
FIG. 2 is a partial elevational view in section.
Figure 3:
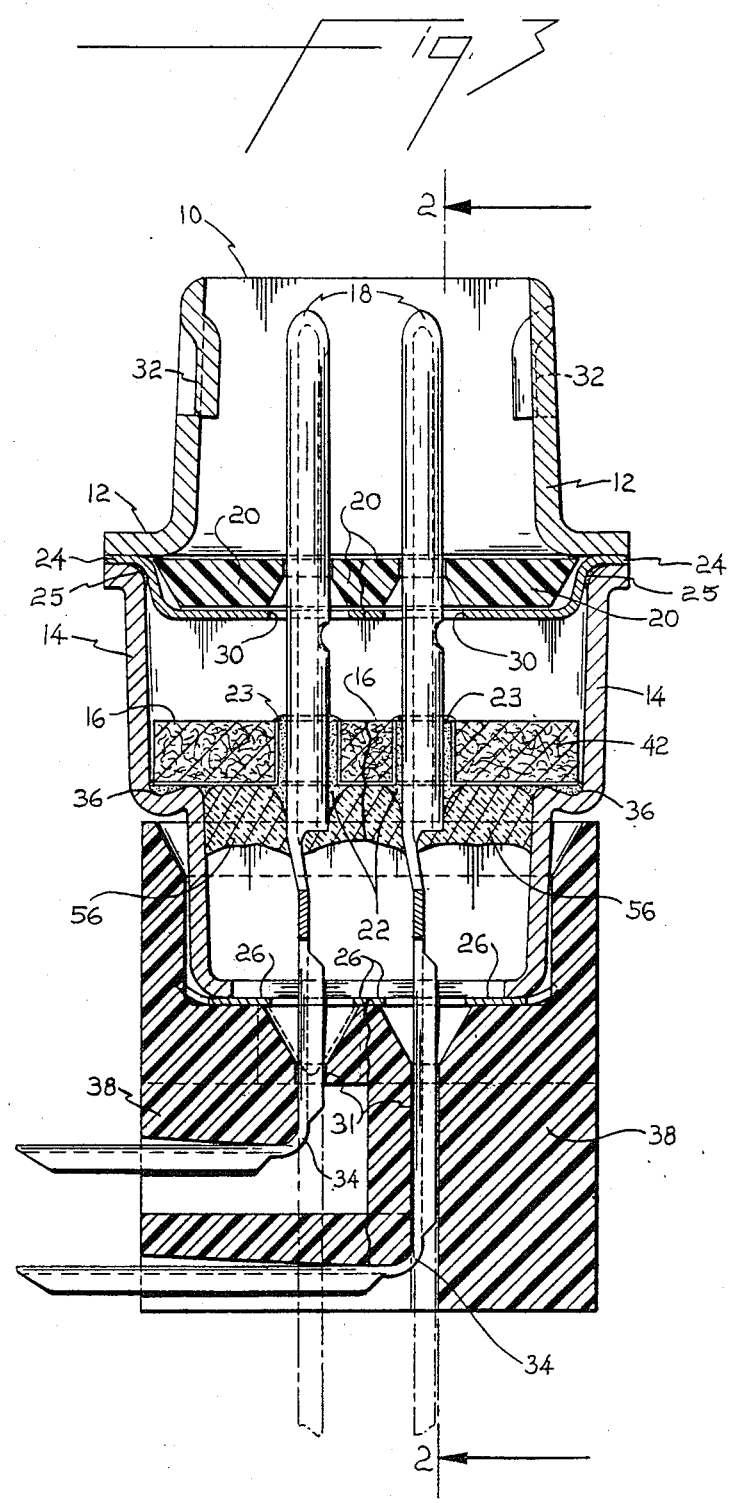
FIG. 3 is a transverse sectional view along 3—3 of FIG. 1.
Figure 5:
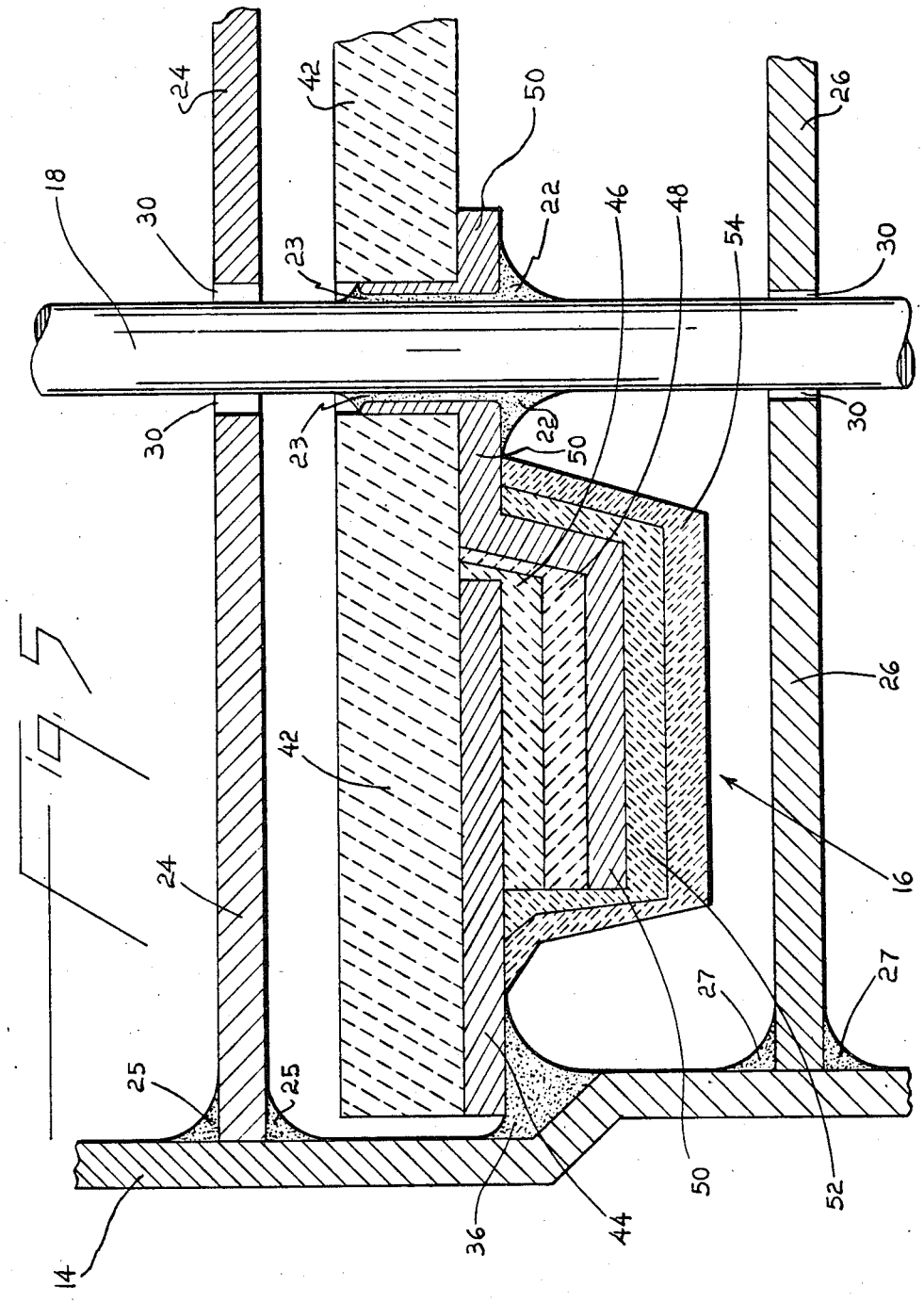
FIG. 5 is a transverse sectional schematic of a filter member and ground plane assembly.

FIGS. 2 and 3 show the joint 25 wherein the top ground plane 24 is soldered to the shell 14. Solder joint 36 grounds an electrode 44 (as seen in FIG. 5) from the filter member 16 to the shell 14. An optional silicone sealant 56 is applied to protect the filter member 16 from moisture penetration.

Figure 4:
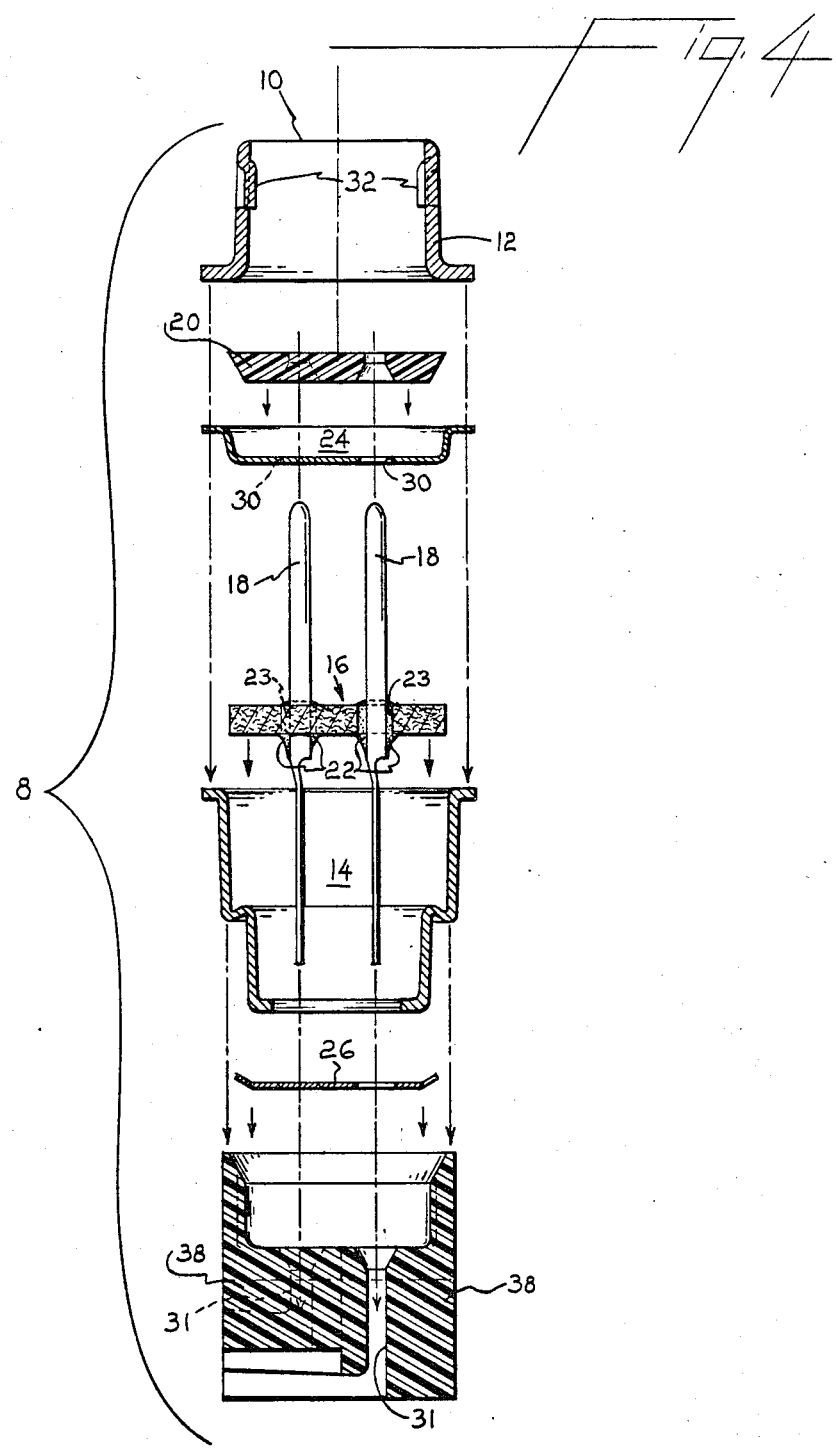
FIG. 4 is an exploded view of the connector parts in section.

FIGS. 3 and 4 show the holes 31 in the insulator 38 permitting passage of pins 18. The solder 22 electrically connects each pin 18 to the filter member 16. The solder 22 is allowed to enter holes in filter member 16 and seal the pin 18 to the filter member 16, as shown at 23.

One type of assembly of ground planes 24 and 26 and filter member 16 is shown in FIGS. 1-5. In this configuration, the first ground plane 24 and second ground plane 26 are conductive metal plates located over and spaced from the surfaces of filter member 16. Ground plane 24 has peripheral edges grounded to shell 14 by solder 25 and ground plane 26 is grounded to shell 14 by solder 27 (as seen in FIG. 5).

As shown schematically in FIG. 5, the filter member 16 has a thick film capacitor unit for each pin and each capacitor unit includes ground and pin electrodes separated by a dielectric. Filter member 16 includes a substrate 42 of alumina. A ground electrode in the form of a first metallization layer 44 is screen printed on the bottom surface of substrate 42 on the outside of each row of pins 18. Layer 44 is grounded to the shell 14 by solder 36. The metallization composition can contain a noble metal such as gold or a palladium/silver alloy, a binder and vehicle. The palladium/silver alloy is preferred. The vehicle is removed during firing of the metallization. Layers 46, 48 of a dielectric material are then screen printed over the electrode 44. Barium titanate has been used as the dielectric but any other type of dielectric material commonly used in the preparation of capacitors can be substituted. Although one layer of barium titanate may be sufficient, it is preferred that two layers be applied by screen printing to ensure against shorting. A pin electrode 50 is prepared by screen printing another layer of the noble metal metallization over the barium titanate dielectric. The electrode 50 is electrically in contact with the pin 18 through solder joint 22. Seal 23 is established by allowing the solder 22 to fill the holes in filter element 16 and thereby secure pin 18 to the filter member 16. The capacitor is then covered with one or more layers 52, 54 of a glass encapsulant to protect the porous dielectric 46 and 48 from moisture. The glass encapsulant can be any of the compositions commonly used in the industry to protect capacitors. Optionally, a silicone sealant 56 shown in FIGS. 1–3, can be added around the glass encapsulant. Holes 30 having diameters wider than the diameters of pins 18 separate the ground planes 24 and 26 from the pins 18.

Figure 6:
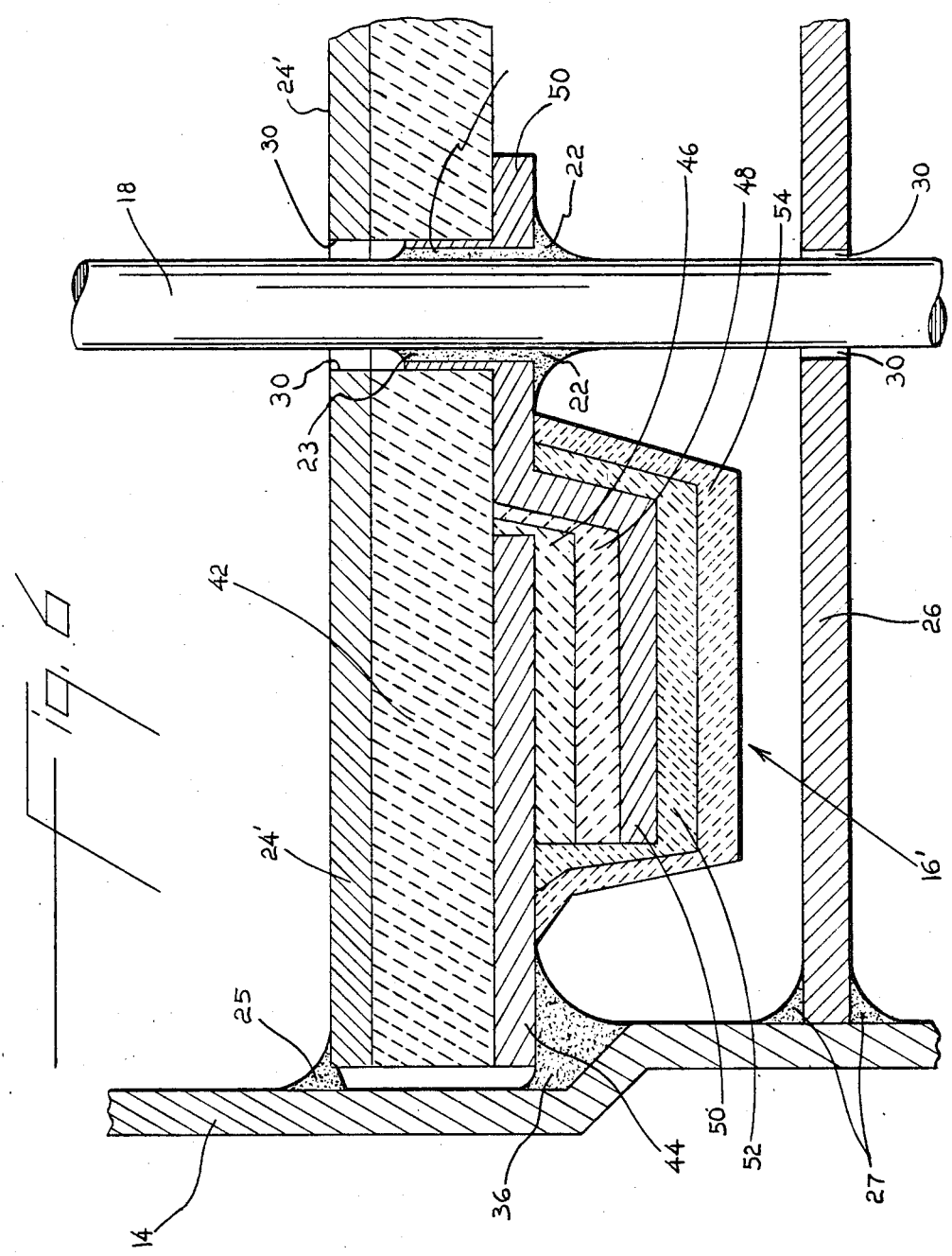
FIG. 6 is a transverse sectional schematic of an alternate filter member and ground plane assembly.

An alternate assembly of filter member and ground planes is shown in FIG. 6. Filter member 16' can have the same configuration shown in FIG. 5. However, the top ground plane 24' is a metallization layer screen-printed over the top surface of the substrate 42. The bottom ground plane 26 is a spaced metal plate of the type shown in FIG. 5.

In FIG. 7, a second alternative ground plane assembly is shown. In this instance, the bottom ground plane 26' differs from the spaced ground plane 26 of FIG. 6 by being a metallization such as palladium/silver screen printed over the top of the glass encapsulant 54 of the filter member 16". The ground plane 24' is the same as shown in FIG. 6.

In FIG. 11, a third alternative ground plane assembly is shown. In this assembly, only one ground plane 24' is employed in association with filter member 16'''. Ground plane 24' is the same as shown in FIG. 7. The only difference in this assembly from the one in FIG. 7 is the deletion of the second ground plane 26'. Ground plane 24' could also be spaced from filter member 16''' as shown for ground plane 24 in FIG. 5.

Referring now to FIGS. 9 and 10, the filter element 16 is prepared by screen printing elongated conductive layers 44 and elongated dielectric layers 46,48 on substrate 42, outside the staggered rows of holes 30. Thus, there is a common ground electrode and a common dielectric for all of the capacitors in each row of holes 30 and the current path is from each pin 18 to the shell 14 (FIGS. 2 and 3). Next, a discrete conductive layer 50 for each pin is screen dielectric layers 46,48. Then, the layers 52, 54 of encapsulant can be added.

Figure 12:
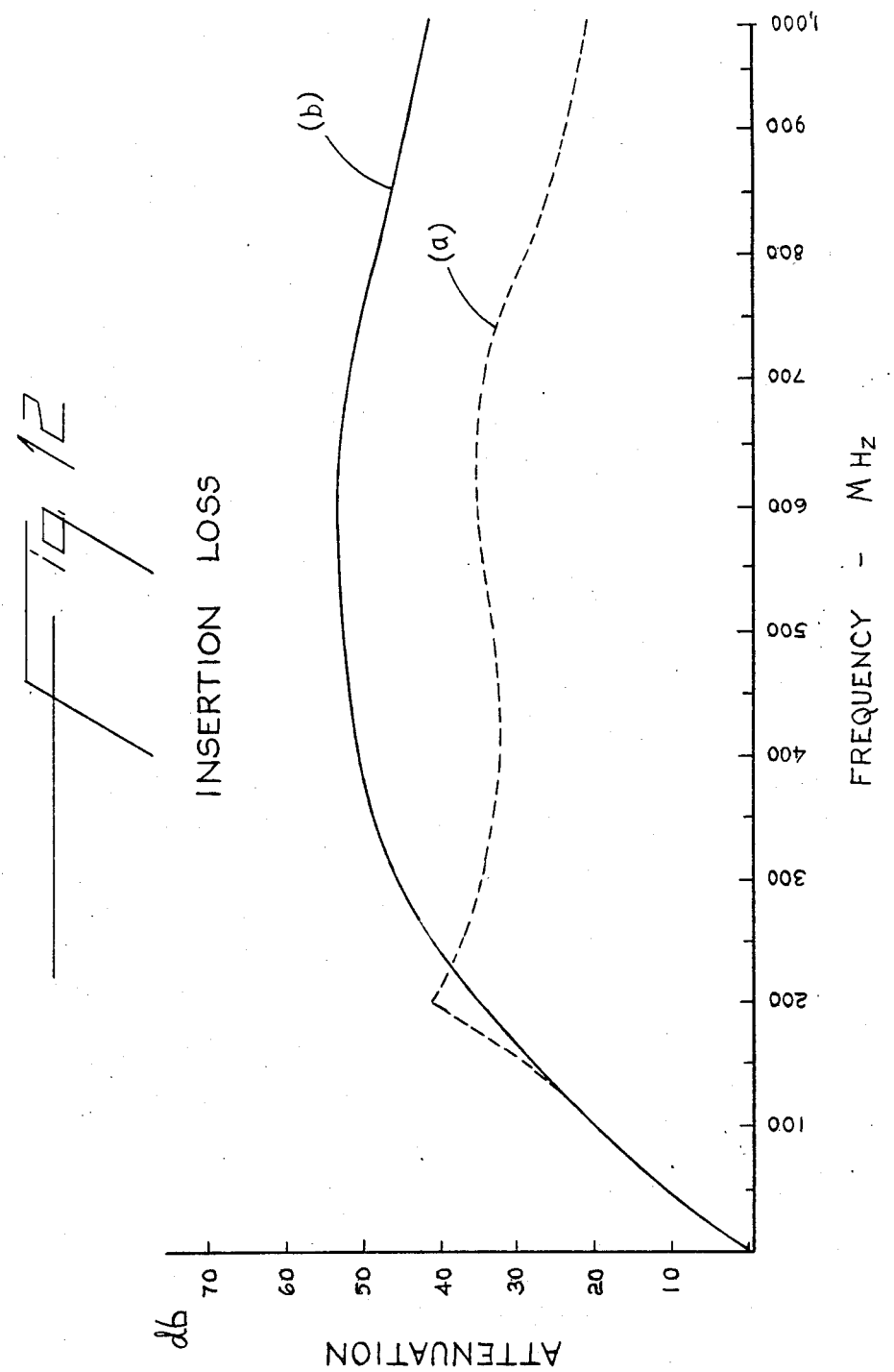
FIG. 12 is a graph showing an attenuation curve for a filter connector without a ground plane and for the same filter connector having a pair of ground planes as shown in FIG. 5.

The addition of ground planes provides an added attenuation of electromagnetic signals up to 1000 MHz. A typical comparison of attenuation curves is shown in FIG. 12. Curve (a) shows an attenuation curve using a filter member of the type shown in FIGS. 9 and 10 carrying thick film capacitors but no ground plane. Curve (b) shows an attenuation of more than 30 dB at 1000 MHz for a connector employing the same filter member but having a pair of ground planes as shown in FIG. 5.

The metal in the spaced ground planes can be any conductive substance such as steel, brass, copper, silver, gold, palladium, platinum or alloys thereof.

The metallization compositions useful in producing the ground planes 24' and 26' screen printed directly to the filter member 16" as shown in FIG. 7 are finely divided metal particles together with binder and vehicle screen printed either on the substrate or on the layers of encapsulant. The dispersion of the metal particles is usually in an inert liquid organic medium or vehicle. Selection of the composition of the metal particles is usually based on a compromise of cost and performance. Performance usually suggests the use of the noble metals or their alloys because they are relatively inert during firing of the laminates to produce electrically continuous conductors. On the other hand, base metals are often oxidized in the air at elevated temperatures and in many cases react with the dielectric material during firing.

A ferrite sleeve 19 also can be attached to the pin 18, as seen in FIG. 8. Such sleeves are well known as seen in U.S. Pat. No. 4,144,509. The use of the ground planes of this invention will increase the filtering action of filter connectors employing ferrites.

Having thus described our invention, what is claimed and desired to be secured by Letters Patent is:

1. In an electrical connector for filtering a wide band of frequencies
comprising a conductive housing enclosing a planar filter member having opposed surfaces and at least one row of conductive pins extending through the opposed surfaces;
the filter member comprising multiple capacitors, there being a capacitor associated with each pin;
each capacitor having at least one conductive layer forming a ground electrode in electrical contact with the housing, at least one conductive layer forming a pin electrode in electrical contact with its respective pin and dielectric material separating the electrodes, the ground electrode being common to all pins in a row and being an elongated conductive layer along one side of the row of pins;
the improvement comprising at least one ground plane disposed over at least one surface of the filter member, the ground plane having peripheral edges in electrical contact with the housing and holes for accommodating the conductive pins without touching the pins, and the further improvement wherein the conductive layer forming the ground electrode, the conductive layer forming the pin electrode, and the dielectric material separating the electrodes are formed by screen printing alternate conductive and dielectric thick film layers on an alumina substrate.

2. The electrical connector of claim 1 wherein there are two parallel rows of pins and the ground electrode associated with each row is positioned between the rows and the housing.

3. The electrical connector of claim 2 wherein ground planes are located over and spaced from both surfaces of the filter member.

4. The electrical connector of claim 2 having ground planes which are metalized thick film layers disposed on both opposed surfaces of the filter member.

5. The electrical connector of claim 2 having one ground plane located over and spaced from one surface of the filter member and another ground plane which is a metalized thick film layer disposed on the opposite surface of the filter member.

* * * * *